(12) United States Patent
Lin

(10) Patent No.: US 6,987,472 B2
(45) Date of Patent: Jan. 17, 2006

(54) BUILT-IN-SELF-TEST APPARATUS AND METHOD FOR ANALOG-TO-DIGITAL CONVERTER

(75) Inventor: Chun Wei Lin, Changhua (TW)

(73) Assignee: Spirox Corporation, Hsinchu (TW)

( * ) Notice: Subject to any disclaimer, the term of this patent is extended or adjusted under 35 U.S.C. 154(b) by 0 days.

(21) Appl. No.: 10/912,179

(22) Filed: Aug. 6, 2004

(65) Prior Publication Data

US 2005/0093723 A1 May 5, 2005

(30) Foreign Application Priority Data

Oct. 29, 2003 (TW) .............................. 92130118 A

(51) Int. Cl.
  H03M 1/10 (2006.01)
  G06F 101/14 (2006.01)
  G06F 15/00 (2006.01)
  G06F 17/18 (2006.01)

(52) U.S. Cl. ...................................... 341/120; 702/180
(58) Field of Classification Search ................ 341/118, 341/120; 250/369; 324/76.15; 375/326, 375/345; 702/107, 180, 126; 710/72; 714/819
See application file for complete search history.

(56) References Cited

U.S. PATENT DOCUMENTS

| | | | | |
|---|---|---|---|---|
| 5,490,091 A | * | 2/1996 | Kogan et al. | 702/180 |
| 5,608,222 A | * | 3/1997 | Hardy, II | 250/369 |
| 6,128,353 A | * | 10/2000 | Ho et al. | 375/345 |
| 6,211,803 B1 | * | 4/2001 | Sunter | 341/120 |
| 6,295,508 B1 | * | 9/2001 | Trammell et al. | 702/107 |
| 6,327,549 B1 | * | 12/2001 | Bingham et al. | 702/180 |
| 6,509,728 B1 | * | 1/2003 | Uchino et al. | 324/76.15 |
| 6,512,472 B1 | * | 1/2003 | Smith et al. | 341/155 |
| 6,658,368 B2 | * | 12/2003 | Wagner et al. | 702/180 |
| 6,731,697 B1 | * | 5/2004 | Boccuzzi et al. | 375/326 |
| 6,751,690 B1 | * | 6/2004 | Swanson | 710/72 |
| 6,798,185 B2 | * | 9/2004 | Tanghe et al. | 324/76.15 |

* cited by examiner

Primary Examiner—Patrick Wamsley
(74) Attorney, Agent, or Firm—Volentine Francos & Whitt, PLLC

(57) ABSTRACT

A built-in-self-test apparatus for an analog-to-digital converter includes a digital-to-analog converter, a low-pass filter, a histogram analyzer and a software engine. The digital-to-analog converter is intended to generate a first signal. The low-pass filter is intended to smoothen the first signal so that an analog-to-digital converter can perform sampling on the smoothened first signal by a second signal, wherein the bit number of the second signal is greater than or equal to that of the first signal, and the frequency of the second signal is a multiple of that of the first signal. The histogram analyzer is electrically connected to the output end of the analog-to-digital converter. The software engine is electrically connected to the output end of the histogram analyzer so as to display the characteristics of the analog-to-digital converter.

16 Claims, 8 Drawing Sheets

BUILT-IN-SELF-TEST APPARATUS AND METHOD FOR ANALOG-TO-DIGITAL CONVERTER

BACKGROUND OF THE INVENTION (A) Field of the Invention

The present invention is related to a built-in-self-test (BIST) apparatus and a BIST method, and more particularly to a BIST apparatus and a BIST method for an analog-to-digital converter (ADC).

(B) Description of the Related Art

Given the advancement of integrated circuits with high integration, more and more circuits are being integrated into a system-on-a-chip, SoC. Plenty of digital-to-analog converters (DACs), ADCs and mixed-signal circuits with a combination of analog function and digital function are applied in fields like wireless communications, data conversion system, satellite communications, etc. Recent years see the development of BIST technology intended for the aforesaid circuits, wherein self-tests are directly conducted on hardware by built-in circuits in order to cut cost and shorten test duration.

In the past, when it came to a BIST intended for an ADC, non-linearity problems commonly found in the course of conversion of analog signals into digital signals were solved using a control circuit to generate a random pattern. However, the generation of a random pattern usually entails using a control circuit with relatively more bits so as to achieve high resolution. Hence, the method of generating a random pattern not only limits the widespread application of the BIST apparatus intended for an ADC but also requires higher investment on hardware.

SUMMARY OF THE INVENTION

An objective of the present invention is to provide a BIST apparatus and a BIST method applied to an ADC, in which linearization and compensation are carried out by a relatively low-speed and low-resolution DAC in tandem with the ADC so that high-level requirements of hardware for a built-in-self-test apparatus in use are reduced, and in consequence the cost is decreased.

In order to achieve the objective, the present invention discloses a BIST apparatus for an ADC, which comprises a DAC, a low-pass filter, a histogram analyzer and a software engine. The DAC is intended to generate a first signal. The low-pass filter is intended to smoothen the first signal so that ADC can perform sampling on the smoothened first signal by a second signal, wherein the bit number of the second signal is greater than or equal to that of the first signal, and the frequency of the second signal is a multiple of that of the first signal. The sampling is intended to define the respective voltage intervals of individual codes. The histogram analyzer is electrically connected to the output end of the ADC so as to calculate the number of appearances of each code of the output signals from the ADC. The software engine is electrically connected to the output end of the histogram analyzer so as to display the characteristics of the ADC.

As to the implementation procedure, a BIST method for an ADC can be generalized as follows. First, a first signal is generated by a DAC and smoothened afterwards. Second, the smoothened first signal is sampled to define the relationship between the codes and the corresponding voltage intervals of the ADC by a second signal, wherein the bit number of the second signal is greater than or equal to that of the first signal, and the frequency of the second signal is a multiple of that of the first signal. Then, a histogram related to the output of the ADC is generated, and the error between the ADC and the DAC is compensated for using the data of the histogram, so as to figure out the correct voltages corresponding to each codes. Finally, static parameters and dynamic parameters of the ADC are calculated, respectively.

The above-mentioned error compensation is achieved by fine tuning voltage in the light of an algorithm simulated by software. Assuming the abscissa and ordinate represent code and voltage respectively, if the statistical area of the code-voltage curve, i.e., the integration of the code versus voltage, of the first signal under a voltage is equivalent to that of the code-voltage curve for the second signal under the voltage, the voltage is deemed the correct voltage for a code.

BRIEF DESCRIPTION OF THE DRAWINGS

The present invention will be described according to the appended drawings in which.

PREFERRED EMBODIMENT OF THE PRESENT INVENTION

Figure 1:
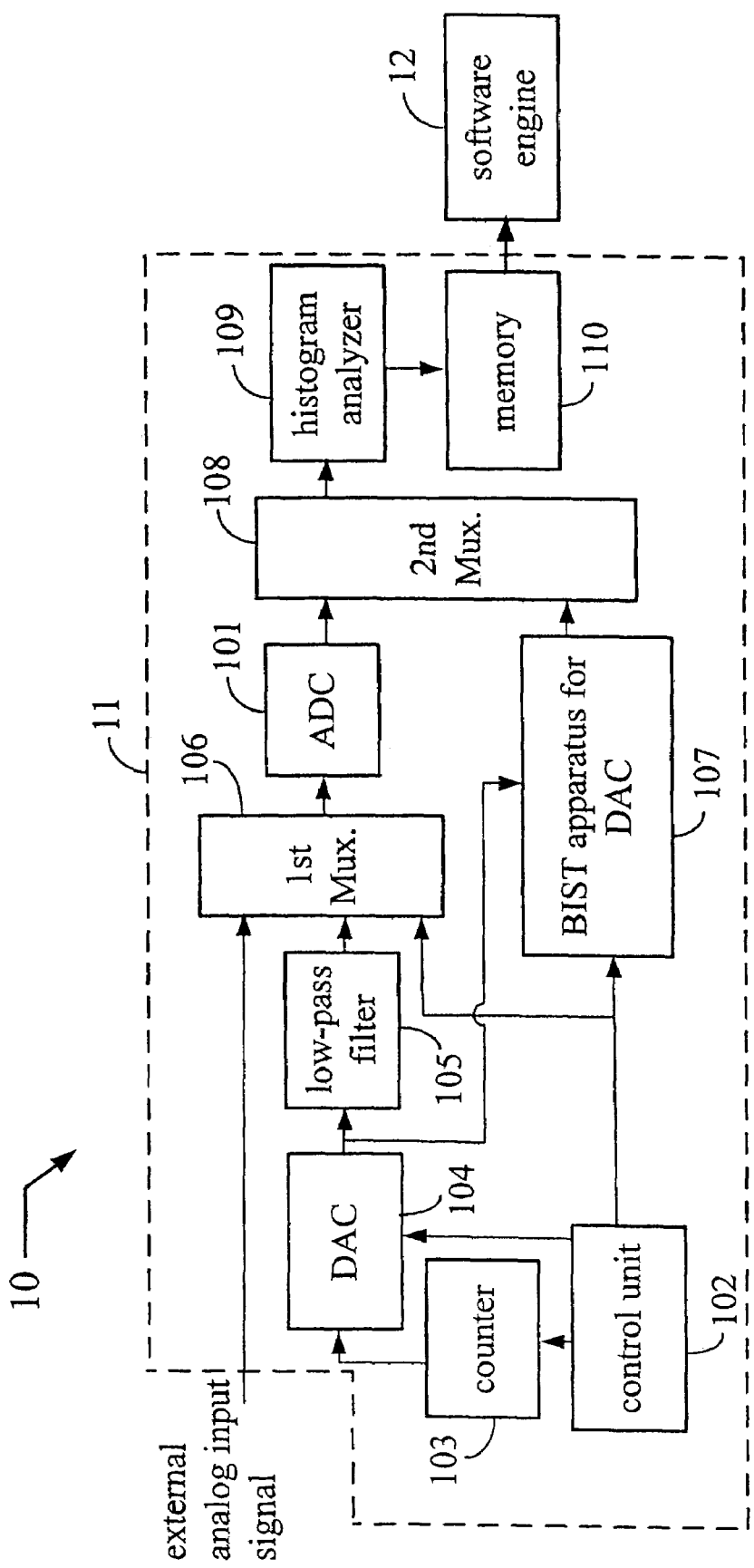
FIG. 1 is a schematic view of the BIST apparatus for an ADC according to the present invention.

FIG. 1 illustrates a BIST apparatus 10 in accordance with the present invention, which is intended for an ADC 101. The BIST apparatus 10 is essentially constituted of a hardware block and a software block, that is, a chip 11 and a software engine 12. The chip 11 comprises the ADC 101, a control unit 102, a counter 103, a DAC 104, a low-pass filter 105, a first multiplexer 106, a BIST apparatus 107 intended for a DAC, a second multiplexer 108, a histogram analyzer 109 and a memory 110. The first multiplexer 106 receives an analog signal output from the DAC 104 and smoothened by the low-pass filter 105 or an external analog input signal, and the output end of the first multiplexer 106 is connected to the ADC 101. In practice, the function of the low-pass filter 105 can be integrated into the DAC 104 to have a simpler circuit. The counter 103 provides counting value for the DAC 104. In the case of 4-bit, signals output from the counter 103 are "0000", "0001" . . . "1111" in order, and then from "1111" . . . "0000". Besides being connected to the low-pass filter 105, the output end of the DAC 104 is further connected to the BIST apparatus 107, so as to enable preliminary calibration to ensure normal operation of the DAC 104 and check analog signals output from the DAC 104 for any error. The control unit 102 is connected to the counter 103, the DAC 104, the first multiplexer 106, and the BIST apparatus 107 to control the operations of the devices. The input end of the second multiplexer 108, serving for signal selection and transmission, is connected to the ADC 101 and the BIST apparatus 107, whereas the output end is connected to the histogram analyzer 109 to select and send signals. Data output from the histogram analyzer 109 is temporarily stored in the memory 110 before being sent to the software engine 12 for subsequent analysis. In this embodiment, the DAC 104 undergoes calibration and testing through the BIST apparatus 107, and thus the software engine 12 has to be capable of analyzing the characteristics of both the DAC 104 and the ADC 101.

In fact, the first multiplexer 106, the second multiplexer 108, the memory 110, the control unit 102, the counter 103 and the BIST apparatus 107 are not essential components for the BIST apparatus 10. However, their presence can augment the effect.

Figure 2:
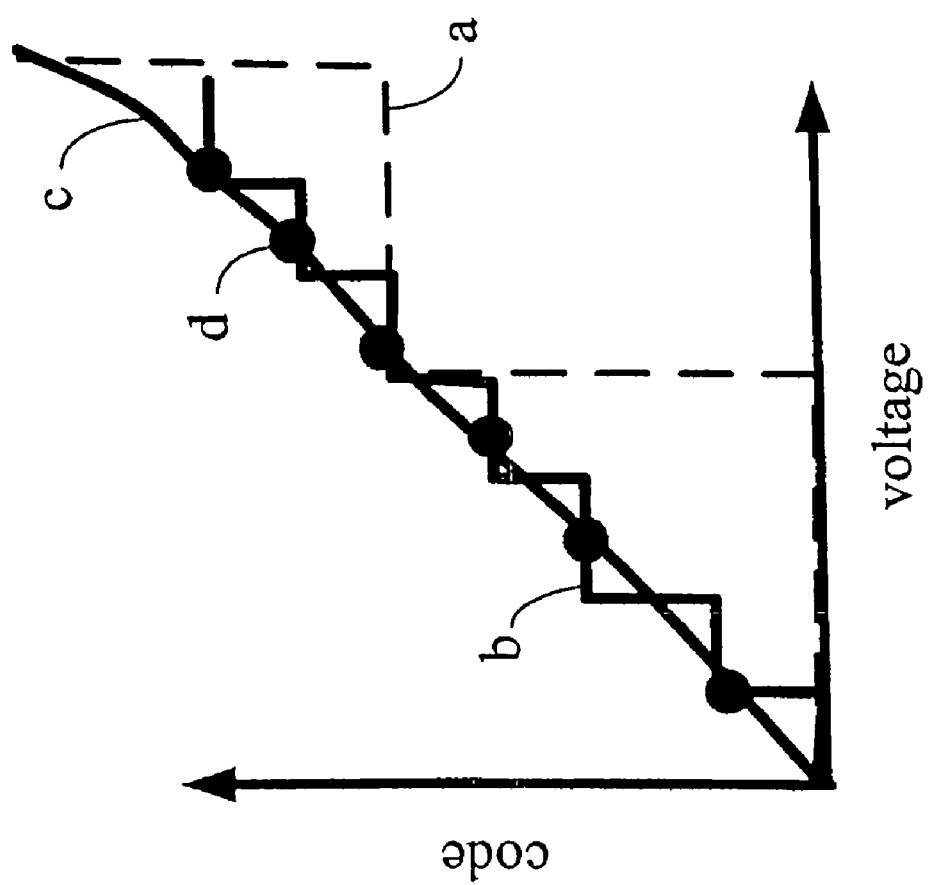
FIG. 2 shows the way to obtain voltage intervals corresponding to individual codes of the BIST method for an ADC according to the present invention.

FIG. 2 illustrates a method for a local linear stimulus, which is intended to expound on the principle of signal conversion that takes place between the DAC 104 and the ADC 101. A first signal output from the DAC 104 and denoted by a dotted line a is characterized by 4-bit and a frequency of f and the ADC 101 outputs a second signal denoted by a solid line b is characterized by 6-bit and a frequency of 4f. Accordingly, the first signal is low-speed and low-resolution in comparison with the second signal. The low-pass filter 105 can smoothen the first signal (the dotted line a) to form a curve c. The solid line b and the curve c cross at a plurality of intersections d, which is like sampling the smoothened first signal (the curve c) at a frequency of 4f by the ADC 101, with a view to identifying the relationship between individual codes and corresponding voltage intervals. As a result, the voltage interval of an external analog input signal can be figured out, and in consequence the corresponding code can be obtained, which is the output of the ADC 101.

The above-mentioned local linear stimulus is carried out in an Ad-hoc combination manner. First, absolute voltages for codes of a large range are specified in the entire code range. Next, a local linear stimulus is employed by locally smoothening to facilitate sampling carried out by the ADC at a relatively high frequency, so as to figure out the respective voltage intervals of individual codes. As a result, a breakthrough to the problem in need of high-resolution, all-time linear testing signals is made, using a source signal with a relatively low resolution.

To sum up, the bit number of the signal of the DAC 104 has to be less than or equal to that of the signal of the ADC 101, and the frequency of the output signal of the ADC 101 must be a multiple of that of the DAC 104, so as to get in line with the criteria that the DAC 104 is low-speed and low-resolution in comparison with the ADC 101.

Figure 3A:
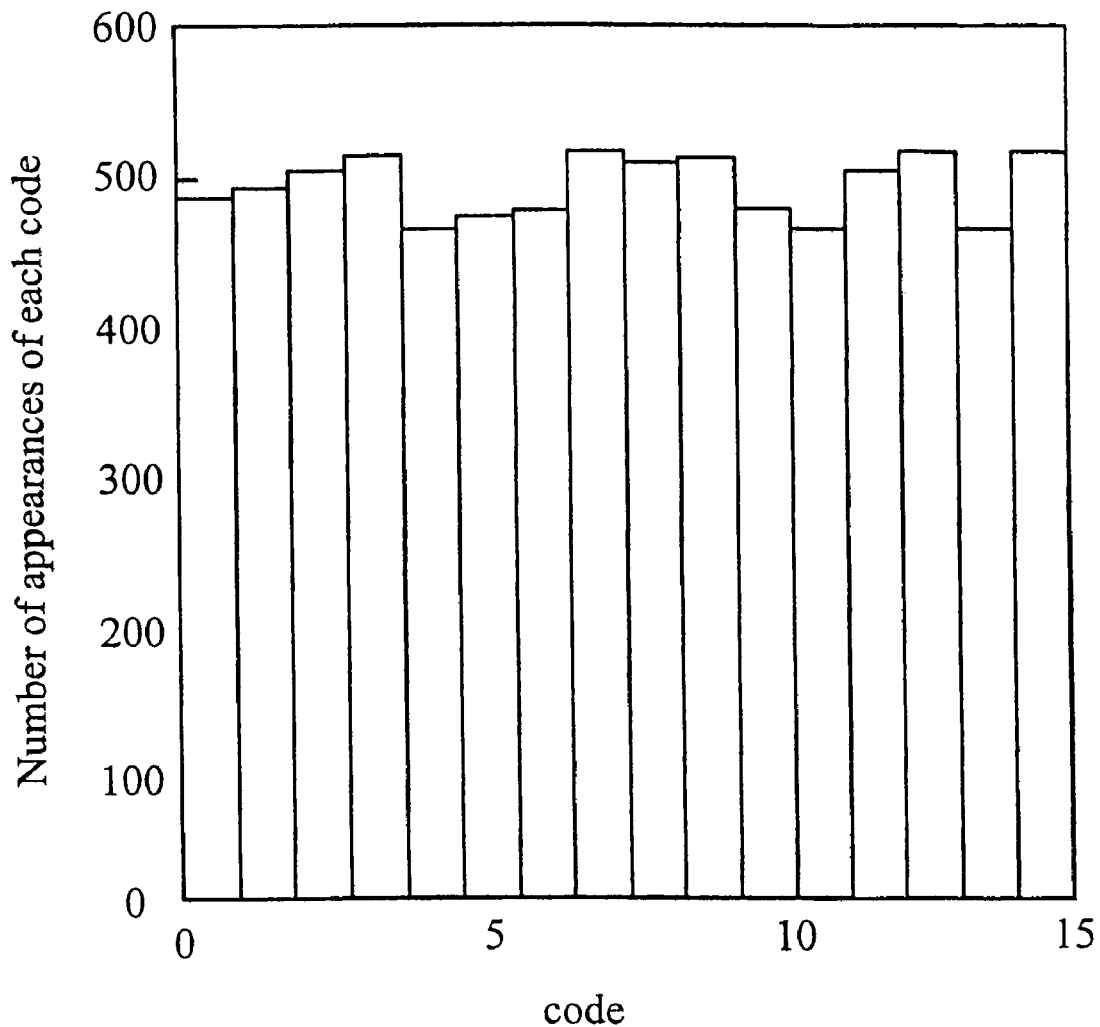
FIGS. 3(*a*) and 3(*b*) show waveforms of a histogram analyzer.
Figure 3B:
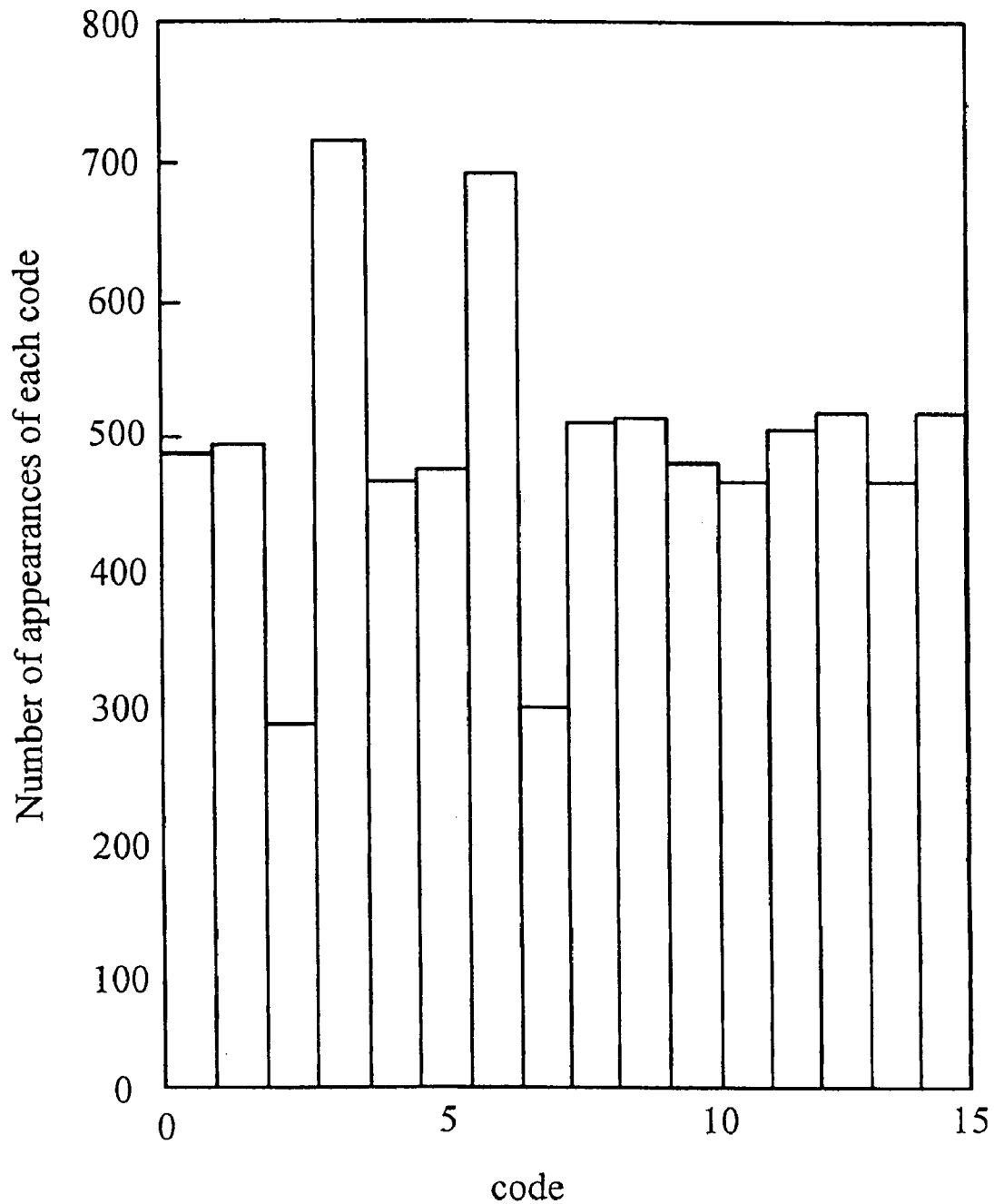

The histogram analyzer 109 conducts a statistical analysis to calculate the number of appearances of each code and draws a histogram, wherein the abscissa denotes codes and the ordinate denotes the numbers of appearances of codes. As shown in FIG. 3(a), as for a digital output signal without an insignificant error, its waveform as displayed by the histogram analyzer 109 is very even. If, as shown in FIG. 3(b), the histogram analyzer 109 displays a waveform that fluctuates greatly, indicating that the digital output signal of the ADC 101 has a considerable error.

Figure 4:
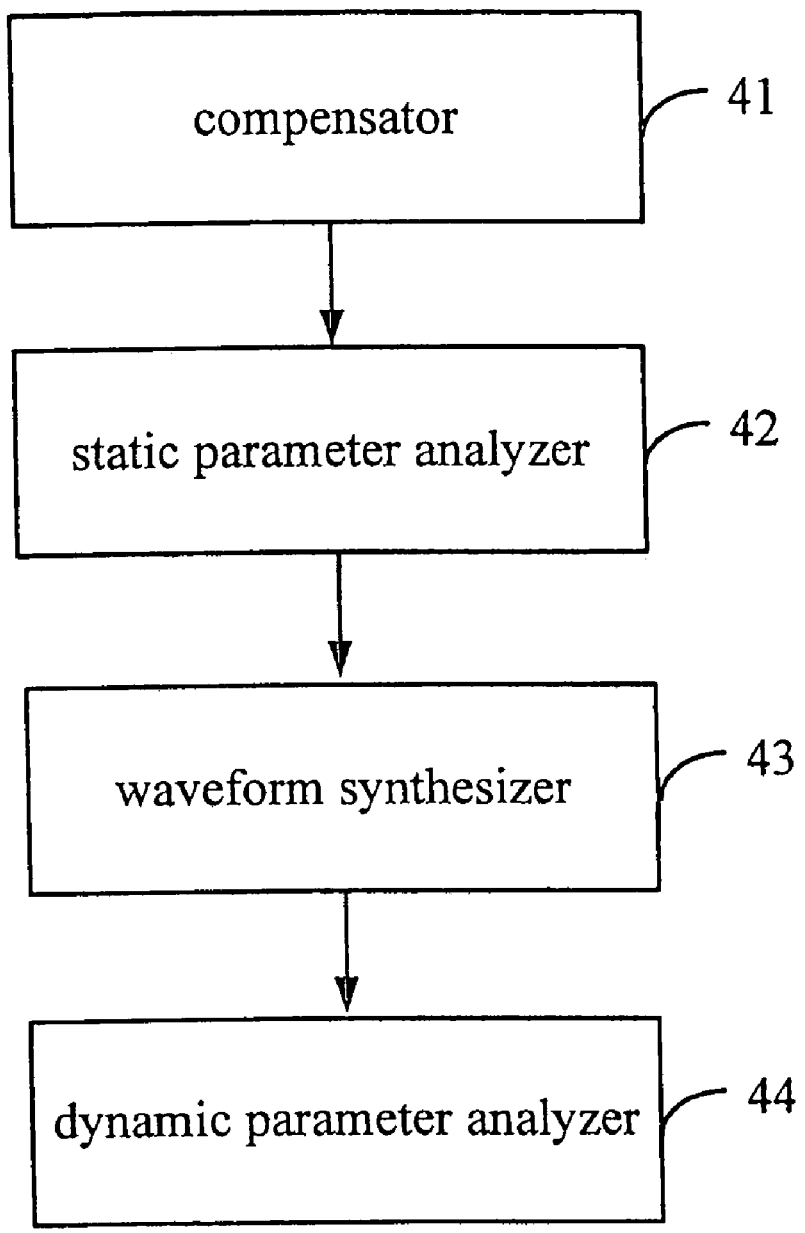
FIG. 4 is a schematic view of the combination of the software engine according to the present invention.

FIG. 4 is a schematic diagram of the software engine 12, which basically comprises a compensator 41, a static parameter analyzer 42, a waveform synthesizer 43, and a dynamic parameter analyzer 44. The compensator 41 is intended to compensate for the error produced between the DAC 104 and the ADC 101. The static parameter analyzer 42 calculates differential non-linearity (DNL) and INL parameters in the light of the output of the compensator 41, where the DNL is an index of the differences among histogram bars in the histogram, and the INL is the sum of the DNL. With the waveform synthesizer 43, a histogram output from the compensator 41 is converted into a trigonometric histogram of probability-domain and then subsequently converted into a time-domain waveform by means of constant sampling, so as to overcome the shortcoming of the conventional art, that is, it is necessary to additionally input a sine wave while a dynamic analysis is underway. The dynamic parameter analyzer 44 uses the time-domain waveform formed by the waveform synthesizer 43 as the input, and thus no additional input like a sine wave is needed to calculate parameters, such as known signal-to-noise ratio (SNR). The operations of the devices of the software engine 12 are described in detail as follows.

Figure 5:
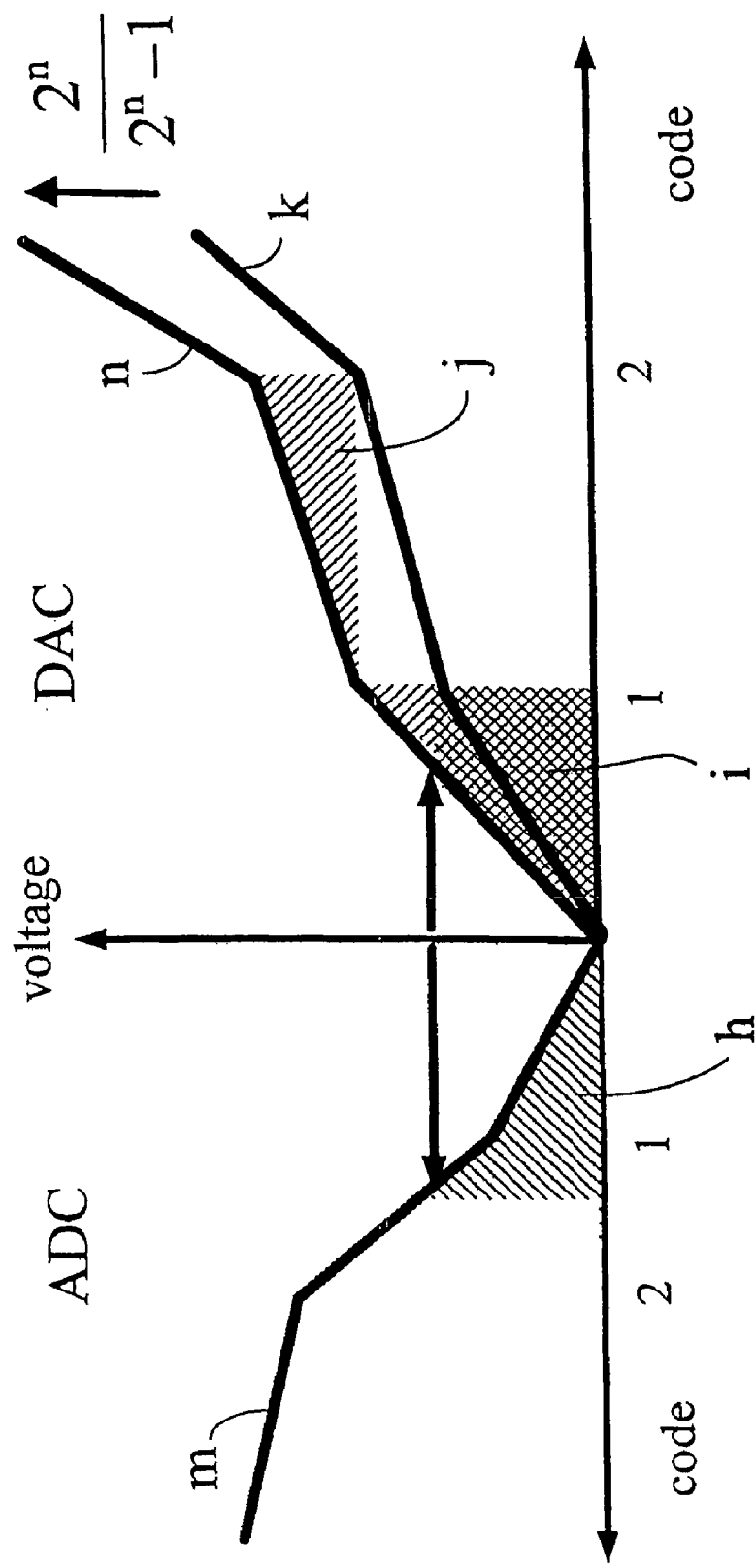
FIG. 5 illustrates the operation of the compensator according to the present invention.

FIG. 5 illustrates the operation of the aforesaid compensator 41, where the ordinate denotes voltages, the abscissa denotes codes, and the left curve m and the right curve k depict the related voltage-code curves to the second signal and the first signal, respectively. In the case of 4-bit, the codes for digital signals are from 0 to 15, but there are 16 voltage intervals in total for analog signals, and thus an adjustment has to be made for the curve k in the light of the proportional error found between these two types of signals. Therefore, the curve k has to be multiplied by 16/15 to generate a curve n. The aforesaid correction proportion can be obtained by the formula $$\frac{2^n}{2^n-1},$$

where n denotes bit number. From a statistical point of view, the area h beneath the curve m represents the number of all histogram bars, whereas the oblique-lined area j beneath the curve n with regard to each code segments represents the number of histogram bars related to each code. The manner to calculate the voltage for a quantization level of 5 is exemplified here. With regard to a voltage of 4.8×LSB (least significant bit), assuming that the area h beneath the curve m is equivalent to the number of all histogram bars where the quantization level of the output of the ADC is less than 5, then the area i denoted by the grid area which overlaps part of the area j beneath the curve n and under the voltage is calculated. The area i represents the number of histogram bars contributed by the DAC 104. If the area h equals the area i, it indicates that the voltage of 4.8×LSB is the correct voltage that corresponds to the quantization level of 5. If, however, the area h does not equal the area i, the 4.8×LSB may be added by a small amount, e.g., 0.05×LSB, that is, 4.85×LSB, which is selected as a new initial reference, and then the aforesaid step is repeated until the two areas are equal. In the case of 10-bit, the aforesaid step has to be repeated for 1023 times ($2^{10}-1=1023$) to figure out the correct voltages corresponding to quantization levels. The adjustment as mentioned above is not carried out in hardware. Instead, it involves calculation done by the software run in the software engine 12.

The static parameter DNL is obtained by subtracting the LSB from the difference among histogram bars denoted by delta, i.e., DNL=delta−LSB. The DNL stands for the error between the voltage corresponding to a signal and an LSB.

Table 1 shows a preferred embodiment applied to a 4-bit ADC, wherein the code "1" stands for "0000," and the code "2" stands for "0001," and the remainder are defined in sequence by analogy. Because analysis is performed on successive codes in this preferred embodiment, the LSB is 1.

TABLE 1

| Code | No. of "0" | No. of "1" | delta | DNL |
|------|------------|------------|-------------|----------|
| 1 | 300 | 340 | 1 | 0 |
| 2 | 298 | 342 | 1.006711409 | 0.006711 |
| 3 | 293 | 347 | 1.023890785 | 0.023891 |
| 4 | 293 | 347 | 1.023897085 | 0.023891 |
| 5 | 292 | 348 | 1.02739726 | 0.027397 |
| 6 | 296 | 344 | 1.013513514 | 0.013514 |
| 7 | 399 | 241 | 0.751879699 | −0.24812 |
| 8 | 242 | 398 | 1.239669421 | 0.239669 |
| 9 | 299 | 341 | 1.003344482 | 0.003344 |
| 10 | 286 | 354 | 1.048951049 | 0.048951 |
| 11 | 243 | 397 | 1.234567901 | 0.234568 |
| 12 | 396 | 244 | 0.757575758 | −0.24242 |
| 13 | 296 | 344 | 1.013513514 | 0.013514 |
| 14 | 295 | 345 | 1.016949153 | 0.016949 |
| 15 | 300 | 340 | 1 | 0 | x is a or b

Figure 6:
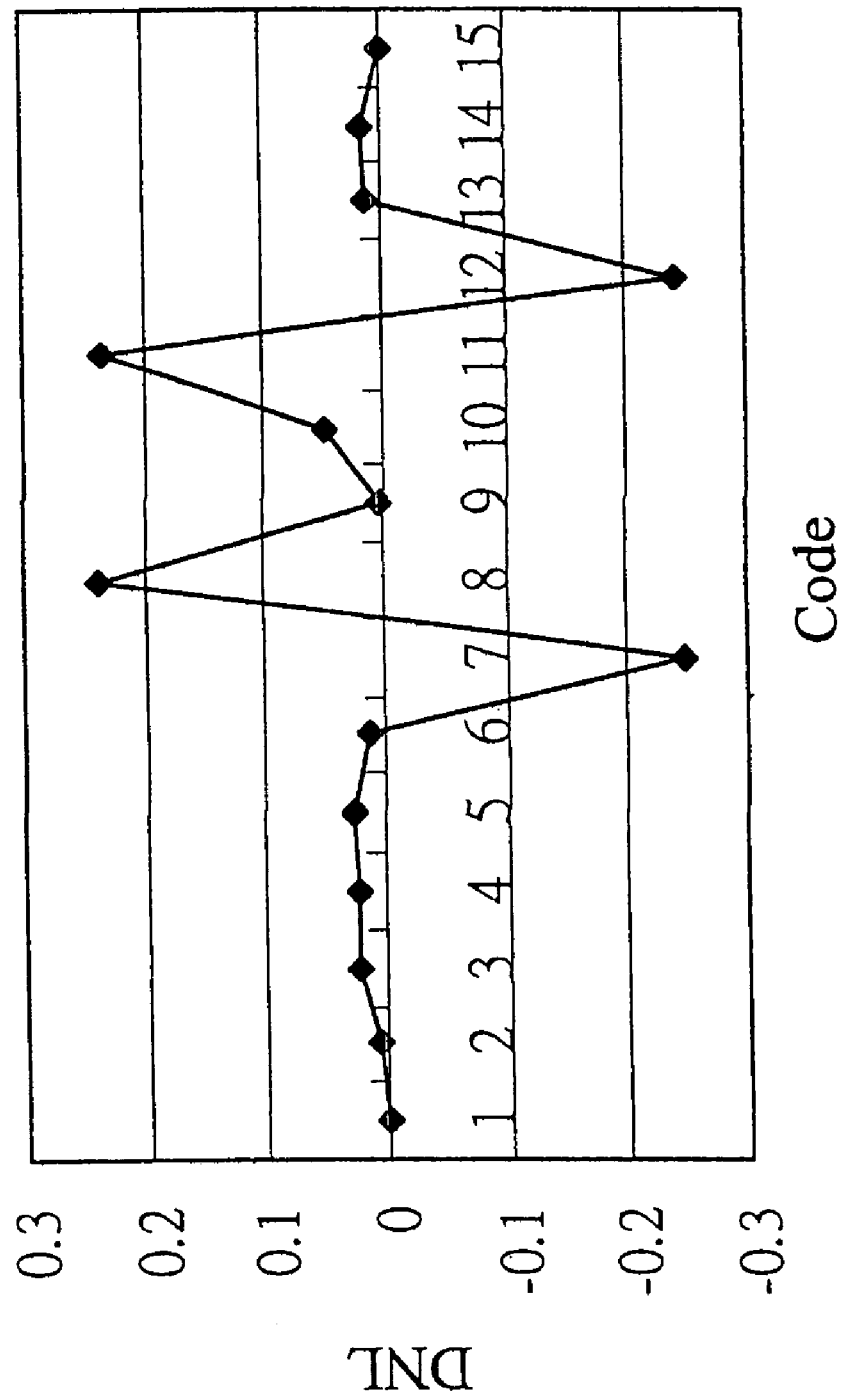
FIG. 6 shows a test result of the BIST apparatus according to the present invention.

FIG. 6 is the curve diagram showing the preferred embodiment illustrated in Table 1. The DNL corresponding to the code "7" is approximately −0.2, obviously deviating from a LSB. In other words, in fact, the code "7" is only approximately 6.8 and, in consequence, the distance between the codes "7" and "8" increases to 1.2. This happens to the codes "11" and "12" as well. Accordingly, it is believed that the errors of the code "7" and the code "11" are too large, and thus the circuit has to be corrected and compensated for.

Figure 7A:
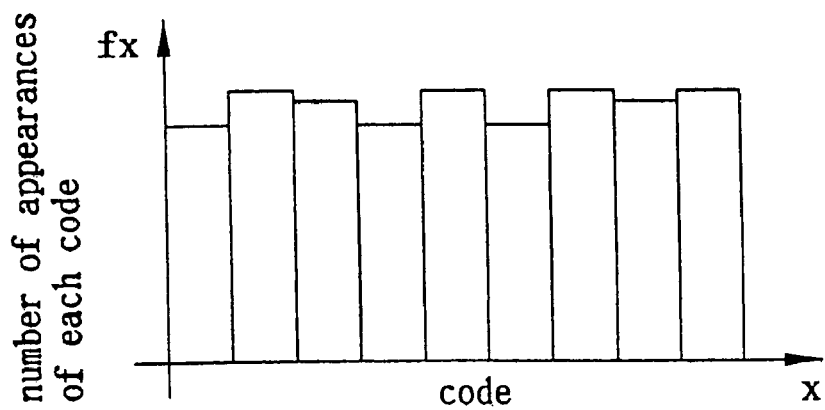
FIGS. 7(*a*) to 7(*c*) show the conversion of a histogram into a time-domain waveform of the waveform synthesizer in accordance with the present invention.
Figure 7B:
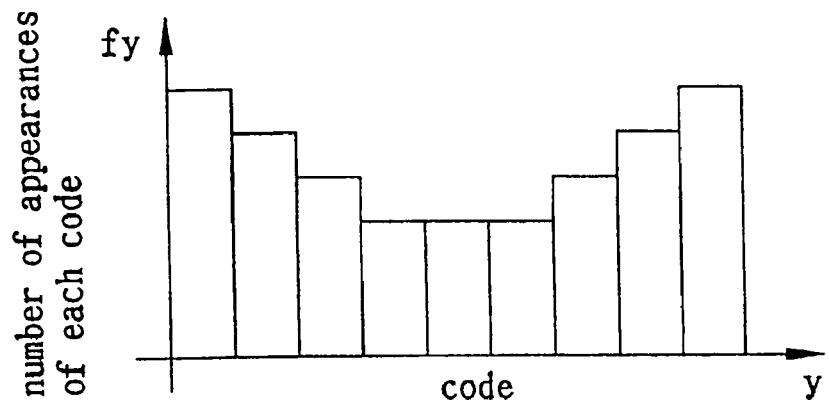

Another feature of the present invention is that a histogram functions as the input sample to the static parameter analyzer 42 and the dynamic parameter analyzer 44 to overcome the shortcoming of the conventional art, that is, it is necessary to additionally input a sine wave while a dynamic analysis is underway. FIG. 7(a) is a statistical diagram about the output of the compensator 41, which undergoes convolution operation in the light of a statistical equation P(n) as shown in equation 1, so as to work out a trigonometric histogram of probability-domain as shown in FIG. 7(b).

$Fy=P(n)*fx$, which * denotes the convolution operation.

$$P(n) = \frac{1}{\pi}\left[\sin^{-1}\left(\frac{B(n-2^{N-1})}{A\times 2^N}\right) - \sin^{-1}\left(\frac{B(n-1-2^{N-1})}{A\times 2^N}\right)\right] \quad \text{equation 1}$$

Wherein n denotes the codes, B is the full-scale range of the ADC 101, A is the amplitude of the sine wave, and N is the bit number of the analog-to-digital converter 101.

Figure 7C:
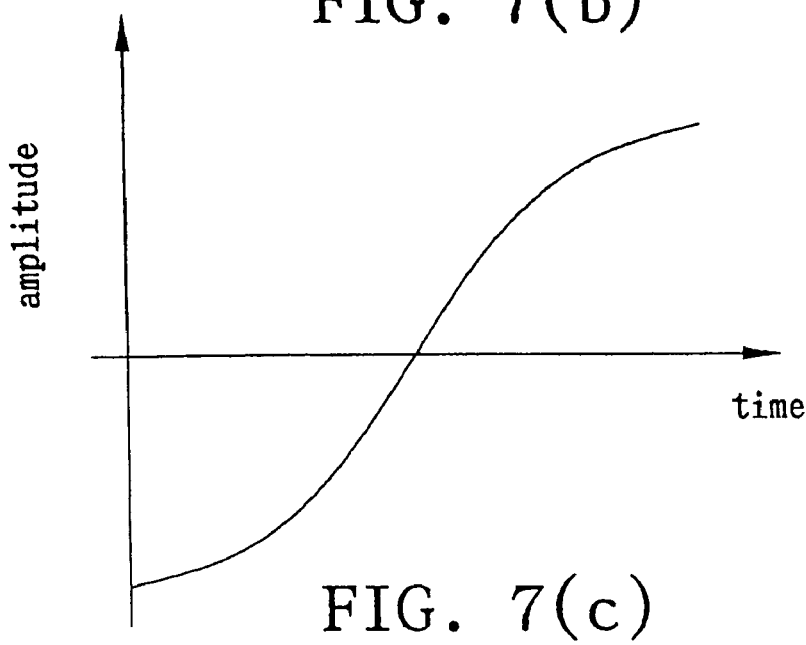

As shown in FIG. 7(c), the waveform synthesizer 43 converts a probability-domain histogram of the ADC 101 into a time-domain waveform by means of constant sampling, which is like to rotate the respective bar charts of all the codes displayed by the ordinate in FIG. 7(b) by 90° and then stack them gradually in the direction of the abscissa in FIG. 7(c). The dynamic parameter analyzer 44 uses the time-domain waveform synthesized by the waveform synthesizer 43 as its input, and thus it can calculate parameters, such as known signal-to-noise ratio without inputting any sine wave additionally.

In accordance with the present invention, it is workable to use a low-speed, low-resolution DAC for solving the non-linearity problem that formerly arose in BIST intended for an ADC, so hardware requirements can be diminished, and in consequence cost can be decreased.

The above-described embodiments of the present invention are intended to be illustrative only. Numerous alternative embodiments may be devised by those skilled in the art without departing from the scope of the following claims.

What is claimed is:

1. A built-in-self-test apparatus for an analog-to-digital converter, comprising:
   a digital-to-analog converter, wherein the bit number of the digital-to-analog converter is less than or equal to that of an analog-to-digital converter to be tested, and the frequency of the analog-to-digital converter to be tested is a multiple of that of the digital-to-analog converter;
   a low-pass filter for smoothening output signals of the digital-to-analog converter and outputting the smoothened signals to the analog-to-digital converter to be tested;
   a histogram analyzer electrically connected to an output end of the analog-to-digital converter to be tested for calculating the number of appearances of each code; and
   a software engine electrically connected to an output end of the histogram analyzer for displaying the features of the analog-to-digital converter to be tested.

2. The built-in-self-test apparatus for an analog-to-digital converter in accordance with claim 1, wherein the software engine comprises:
   a compensator for removing an error between the digital-to-analog converter and the analog-to-digital converter to be tested;
   a static parameter analyzer; and
   a dynamic parameter analyzer.

3. The built-in-self-test apparatus for an analog-to-digital converter in accordance with claim 2, wherein the software engine further comprises a waveform synthesizer which converts an output histogram of the histogram analyzer into a trigonometric histogram of probability-domain and then converts the trigonometric histogram into a time-domain waveform by constant sampling.

4. The built-in-self-test apparatus for an analog-to-digital converter in accordance with claim 3, wherein the dynamic parameter analyzer uses the time-domain waveform output from the waveform synthesizer as an input sample.

5. The built-in-self-test apparatus for an analog-to-digital converter in accordance with claim 2, wherein the compensator fine tunes voltage to obtain the correct voltage corresponding to each code.

6. The built-in-self-test apparatus for an analog-to-digital converter in accordance with claim 5, wherein the compensator integrates the code of the analog-to-digital converter to be tested and the digital-to-analog converter by voltage to obtain the correct voltage corresponding to the code.

7. The built-in-self-test apparatus for an analog-to-digital converter in accordance with claim 1, further comprising a built-in-self-test apparatus for the digital-to-analog converter, which is connected to an output end of the digital-to-analog converter for calibrating and testing the digital-to-analog converter.

8. The built-in-self-test apparatus for an analog-to-digital converter in accordance with claim 1, further comprising a counter for providing a counting value to the digital-to-analog converter.

9. The built-in-self-test apparatus for an analog-to-digital converter in accordance with claim 1, further comprising a memory for temporarily storing output data of the histogram analyzer.

10. A built-in-self-test method for an analog-to-digital converter, comprising the steps of:
generating a first signal by a digital-to-analog converter;
smoothening the first signal;
sampling the smoothened first signal by a second signal to define the relation between codes and voltage intervals of an analog-to-digital converter to be tested, wherein the bit number of the second signal is greater than or equal to that of the first signal, and the frequency of the second signal is a multiple of that of the first signal;
generating a histogram from outputs of the analog-to-digital converter to be tested;
compensating errors between the analog-to-digital converter to be tested and the digital-to-analog converter to obtain correct voltage to each code;
calculating static parameters of the analog-to-digital converter to be tested; and
calculating dynamic parameters of the analog-to-digital converter to be tested.

11. The built-in-self-test method for an analog-to-digital converter in accordance with claim 10, wherein the static and dynamic parameters use the same histogram.

12. The built-in-self-test method for an analog-to-digital converter in accordance with claim 10, further comprising the step of converting a histogram of the static parameters into a trigonometric histogram of probability-domain and then converting the trigonometric histogram into a time-domain waveform by constant sampling so as to act as an input sample for calculation of the dynamic parameters.

13. The built-in-self-test method for an analog-to-digital converter in accordance with claim 10, wherein the correct voltage is obtained by fine tuning voltage.

14. The built-in-self-test method for an analog-to-digital converter in accordance with claim 10, wherein if the integration of code versus voltage of the first signal under a voltage is equal to the integration of code versus voltage of the second signal, the voltage is the correct voltage of the code.

15. The built-in-self-test method for an analog-to-digital converter in accordance with claim 10, wherein the function of smoothening the first signal is integrated into the digital-to-analog converter.

16. The built-in-self-test method for an analog-to-digital converter in accordance with claim 10, wherein the steps of compensating the error between the analog-to-digital converter to be tested and the digital-to-analog converter and calculating static and dynamic parameters of the analog-to-digital converter to be tested are performed by a software engine.

* * * * *